(12) United States Patent
Holger

(10) Patent No.: US 12,228,425 B2
(45) Date of Patent: Feb. 18, 2025

(54) MEASURING APPARATUS WITH A HOUSING AND CORRESPONDING USE

(71) Applicant: Opus Inspection, Inc., East Granby, CT (US)

(72) Inventor: Frank Holger, Titsee-Neustadt, MI (US)

(73) Assignee: Opus Inspection, Inc., East Grandby, CT (US)

( * ) Notice: Subject to any disclaimer, the term of this patent is extended or adjusted under 35 U.S.C. 154(b) by 237 days.

(21) Appl. No.: 17/962,482

(22) Filed: Oct. 8, 2022

(65) Prior Publication Data
US 2023/0135984 A1    May 4, 2023

Related U.S. Application Data

(63) Continuation of application No. PCT/EP2021/054636, filed on Feb. 25, 2021.

(30) Foreign Application Priority Data

Apr. 8, 2020 (DE) .......................... 102020109889.8

(51) Int. Cl.
*G01D 11/24* (2006.01)
*G01D 3/036* (2006.01)
*H05K 7/20* (2006.01)

(52) U.S. Cl.
CPC ......... *G01D 11/245* (2013.01); *G01D 3/0365* (2013.01); *H05K 7/20145* (2013.01); *H05K 7/20172* (2013.01); *H05K 7/20209* (2013.01)

(58) Field of Classification Search
None
See application file for complete search history.

(56) References Cited

U.S. PATENT DOCUMENTS

2013/0265054 A1* 10/2013 Lowery, Jr. .......... G01R 33/448
324/319

FOREIGN PATENT DOCUMENTS

DE         9116755 U1 * 10/1993

* cited by examiner

*Primary Examiner* — John E Breene
*Assistant Examiner* — Nigel H Plumb
(74) *Attorney, Agent, or Firm* — Von Rohrscheidt Patents

(57) ABSTRACT

A measuring apparatus including at least one housing part including a shaped body made from a foam material, wherein the shaped body forms at least one ventilation channel including at least one fan so that at least one component of the measuring apparatus is coolable, wherein the shaped body includes at least one recess configured to receive the at least one component, wherein the at least one recess is adapted to a shape of the at least one component of the measuring apparatus.

11 Claims, 7 Drawing Sheets

MEASURING APPARATUS WITH A HOUSING AND CORRESPONDING USE

This application is a continuation of International application PCT/EP2021/054636 filed on Feb. 25, 2020 that claims priority from German patent application DE 10 2020 109 889.8 filed on Apr. 8, 2020. Both of which are incorporated in their entirety by this reference.

FIELD OF THE INVENTION

The invention relates to measuring apparatus with a housing and a corresponding use.

BACKGROUND OF THE INVENTION

Measuring apparatuses with plural components are typically arranged in a housing wherein a respective frame is formed from injection molded synthetic material or metal and supports the individual components. In order to assure reception and arrangement of the individual components in the housing the components are bolted down in the housing with additional supports at various levels. This creates a high level of assembly complexity. Furthermore, noise reduction is implemented by additional suitable measures like e.g. sound dampening plates since this type of equipment emits a high noise level.

In order to protect the components against vibrations and jolts, so called 2K housings are used where the housing of the measuring apparatus is made from two components or layers. A 2K—housing is made e.g. using a complex two component injection molding method which requires special machinery and expensive molds. A less complex method for producing the 2K—housing. the so-called re-insertion technology. however, is unsuitable for larger production runs due to the low level of automation.

In order to cool individual components of the measuring apparatus a fan is arranged in a housing wall. This can make it difficult to control energy flows, in particular heat flows since unknown air turbulence may be created in the apparatus.

Running the gas flow through the apparatus using hoses can cause problems from kinks in the hoses or disengagement of the hoses from the hose connection

BRIEF SUMMARY OF THE INVENTION

Thus. it is an object of the invention to provide a measuring apparatus with an improved housing The object is achieved in particular by a measuring apparatus including at least one housing part including a shaped body made from a foam material.

Advantageously air spaces in an interior of the measuring apparatus can be filled easily. Thus. the components can be received and arranged in a simple manner without a bolted connection since the individual components of the measuring apparatus can be supported in the shaped body made from the foam material. This facilitates a flexible and compact functionality. Advantageously the components do not have to be fixed at a frame or similar. The invention takes advantage of the fact that the components can be integrated in a positive form locking manner into the measuring apparatus due to the homogenous configuration. Thus, the components can remain in position during vibrations and jolts. This, helps to prevent or reduce a tearing of component supports or a movement of the components in the measuring apparatus. Using the foam material also provides noise reduction so that no additional measures are required.

According to an advantageous embodiment of the invention the foam body is made from a foam material that is made from an expanded synthetic material. The shape body can be formed e.g. from a foam material made from expanded polypropylene (EPP). Alternatively or additionally the shaped body can be formed from a synthetic material made from expanded polystyrol (EPS).

However, also other suitable expanded synthetic materials can be used in the shaped body to form the at least one housing part of the measuring apparatus. These include e.g. expanded polyethylene (EPE) and/or expandable copolymers. Advantageously. a mechanical protection of sensitive components against vibrations and jolts can be provided. The invention takes advantage of the fact that the expanded synthetic materials are resistant against mechanical impact due to dampening properties and high level of pressure resistance.

According to an advantageous embodiment of the invention, the shaped body forms at least one ventilation channel in which at least one fan is arranged so that at least one component of the measuring apparatus is coolable. Thus, a substantially closed air path can be formed from the fan to the at least one component. Advantageously, at least one component. in particular also additional components of the measuring apparatus can be received in the shape body made from the synthetic material and can be cooled through the established ventilation channel. The invention uses the fact that air flows that are required to cool the component at risk can be flowed past the component in a controlled manner. Thus. kinking hoses is not possible since no hoses are used. Using the shaped body made from the foam material achieves a tight seal between two adjacent components or shaped body parts in spite of relatively large tolerances in order to seal the ventilation channel tight. Advantageously. ventilation can be controlled in a stable manner.

According to an advantageous embodiment of the invention, the shaped body is configured in several components. In particular at least two shaped body parts of the shaped body are connected with one another by positive form locking. This way the components can be embedded and enclosed. Advantageously the individual components can be arranged in various assembly planes e.g. when more then two shaped body parts are being used. This facilitates space saving installation on plural levels. Advantageously additional supports and bolts can be omitted due to the use of the multi part shaped body from the foam material which helps to save weight and/or reduce fabrication costs According to an advantageous embodiment of the invention, the at least one ventilation channel is routed so that at least two components of the measuring apparatus are coolable. The components can be coolable e.g. in series. Alternatively, or additionally the components can be coolable in parallel. Thus. the at least one ventilation channel is routed and configured accordingly.

Thus. in particular the at least one ventilation channel can run at more than one level so that components that are arranged on several levels are coolable.

According to an advantageous embodiment of the invention, a temperature sensor is arranged in the at least one ventilation channel and controls the at least one fan. This way a desired operating temperature can remain stable.

According to an advantageous embodiment of the invention, the at least one component of the measuring apparatus forms undercuts with reference to the shaped body that keep the shaped body assembled in a mounted condition. Thus, the entire measuring apparatus is self-supporting when assembled.

According to an advantageous embodiment of the invention, the shaped body includes at least one recess configured to receive the at least one component. In particular the at least one recess can be adapted to a shape of the at least one component of the measuring apparatus. Advantageously the at least one component is supported in the shaped body in a form stable manner. Form stable means e.g. that the components are fixed with respect to their relative movabilities.

According to an advantageous embodiment of the invention, at least one compression rib is arranged protruding outward from a side wall of the shaped body and into the at least one recess. This assures that the individual components are reliably and firmly supported.

According to an advantageous embodiment of the invention. at least one additional housing is arranged about the shaped body and advantageously includes at least one ventilation slot. The ventilation slot is advantageously arranged at a location where the at least one ventilation channel exits. Advantageously additional protection and/or easy transportability is achievable by installing the additional housing. The additional housing can be advantageously made from metal or a synthetic material. This assures that the shaped body can be formed from a foam material with at least one ventilation slot which facilitates arranging the shaped body in the at least one compatible housing made from the metal or the synthetic material.

According to an advantageous embodiment of the invention. a foam material is used to form a housing of a measuring apparatus, in particular of the measuring apparatus described supra and/or of a measuring apparatus according to one of the claims related to the measuring apparatus.

BRIEF DESCRIPTION OF THE DRAWINGS

The invention is subsequently described with reference to advantageous embodiments but not limited to these embodiments. Additional embodiments can be generated by combining features of individual or plural patent claims amongst each other or with individual or plural features of the embodiments. The invention will now be described based on these advantageous embodiments with reference to drawing figures, wherein.

DETAILED DESCRIPTION OF THE INVENTION

FIGS. 1-7 illustrates a measuring apparatus 1 in various embodiments.

Figure 1:
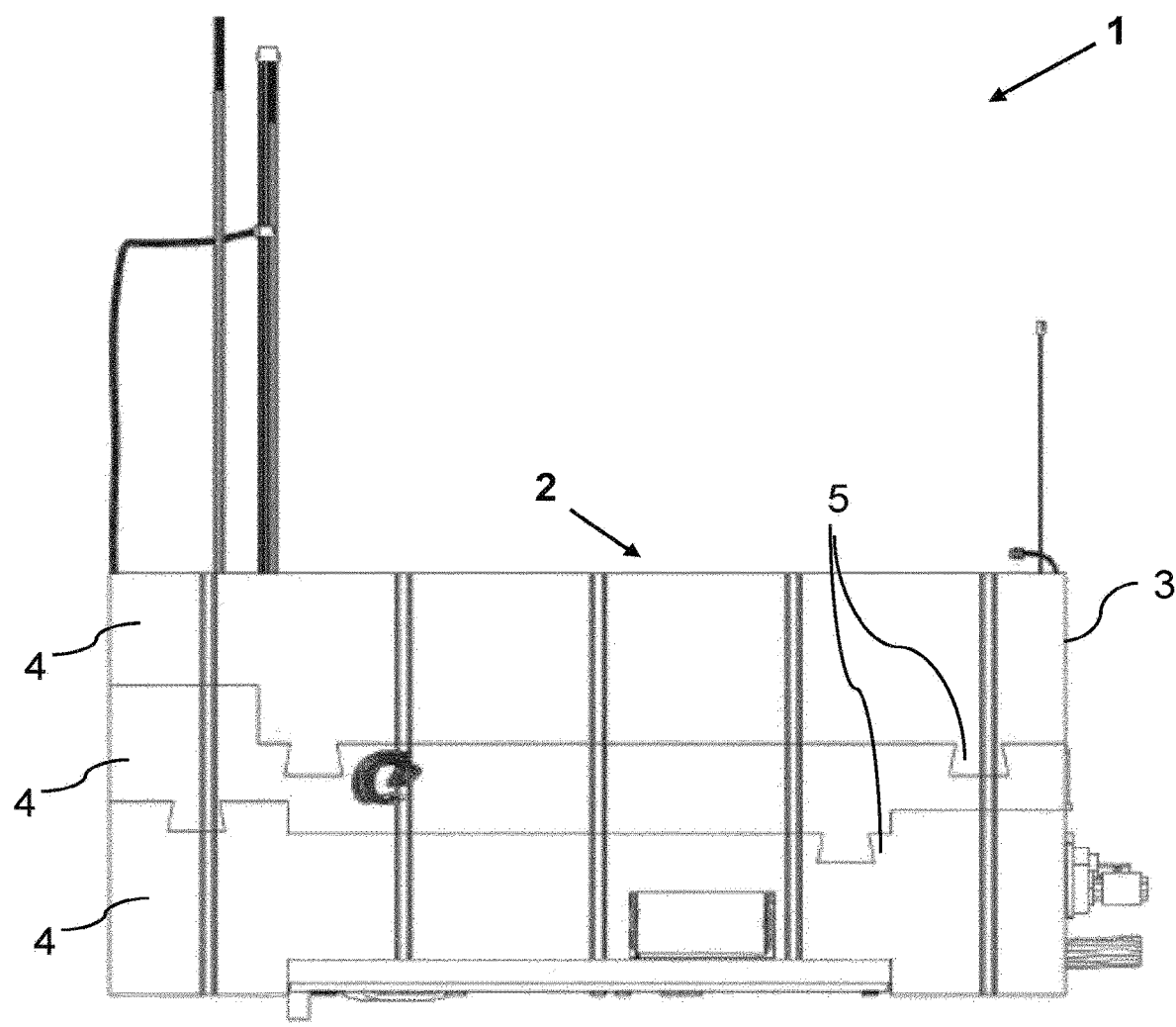
FIG. 1 illustrates a measuring apparatus with a three-piece housing in an external side view.

In the embodiments of the measuring apparatus illustrated herein the housing 2 includes a shaped body 3 made from three shaped body parts 4. Additional embodiments include another number of shaped body parts, e.g. more than three or less than three FIG. 1 illustrates a measuring apparatus 1 with a housing 2 in an external side view. It is evident from FIG. 1 that the housing 2 includes a shaped body 3 made from three shaped body parts 4. The individual shaped body parts 4 are connected with one another by positive form locking. The mutual engagement of the illustrated form body part 4 generates a positive form locking connection 5 wherein the connected partners cannot separate from each other even when no force is transferred or when the force transfer is interrupted.

Figure 2:
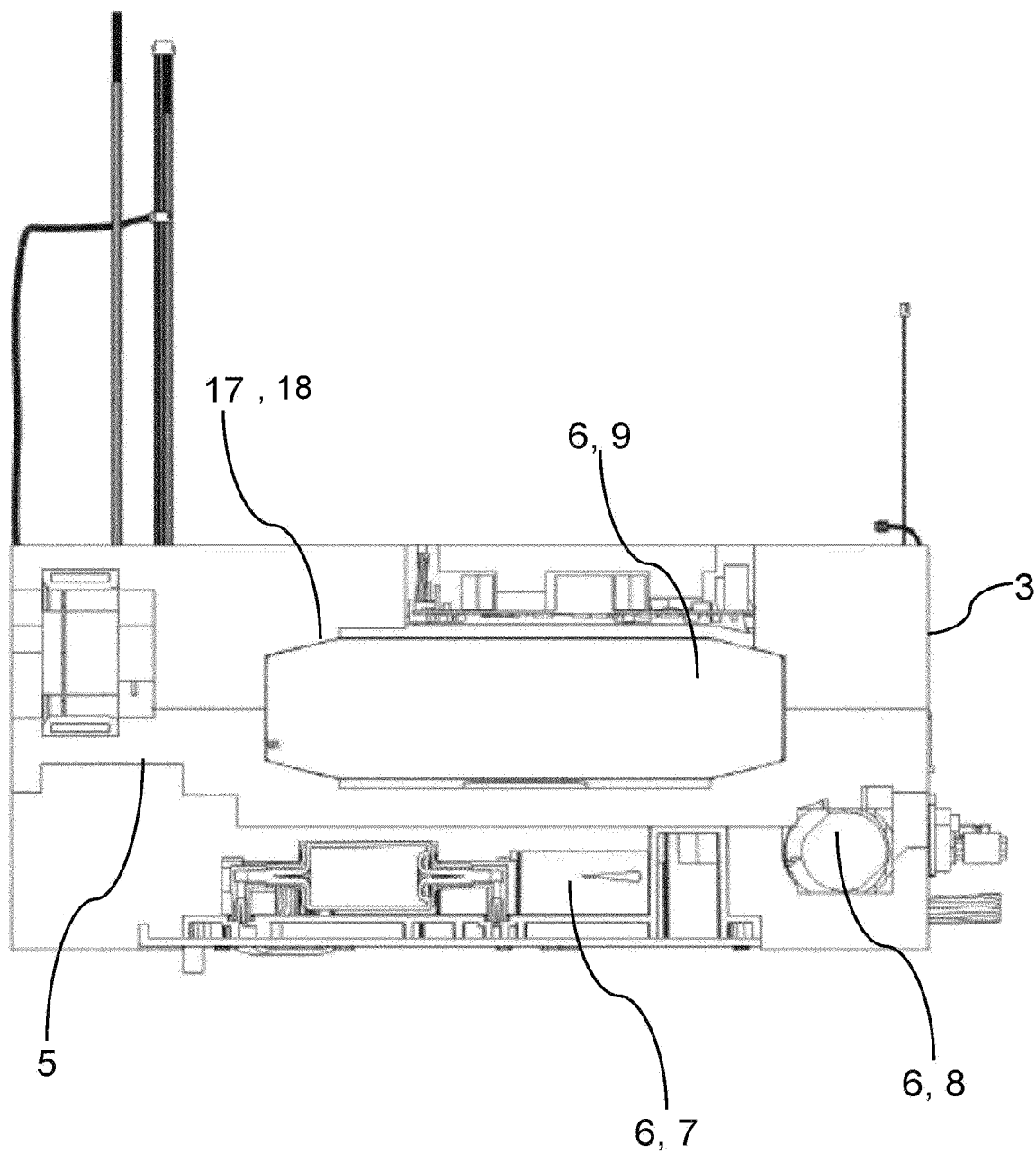
FIG. 2 illustrates the measuring apparatus according to FIG. 1 with the three-piece housing in a cross-sectional viewing showing a fan.
Figure 3:
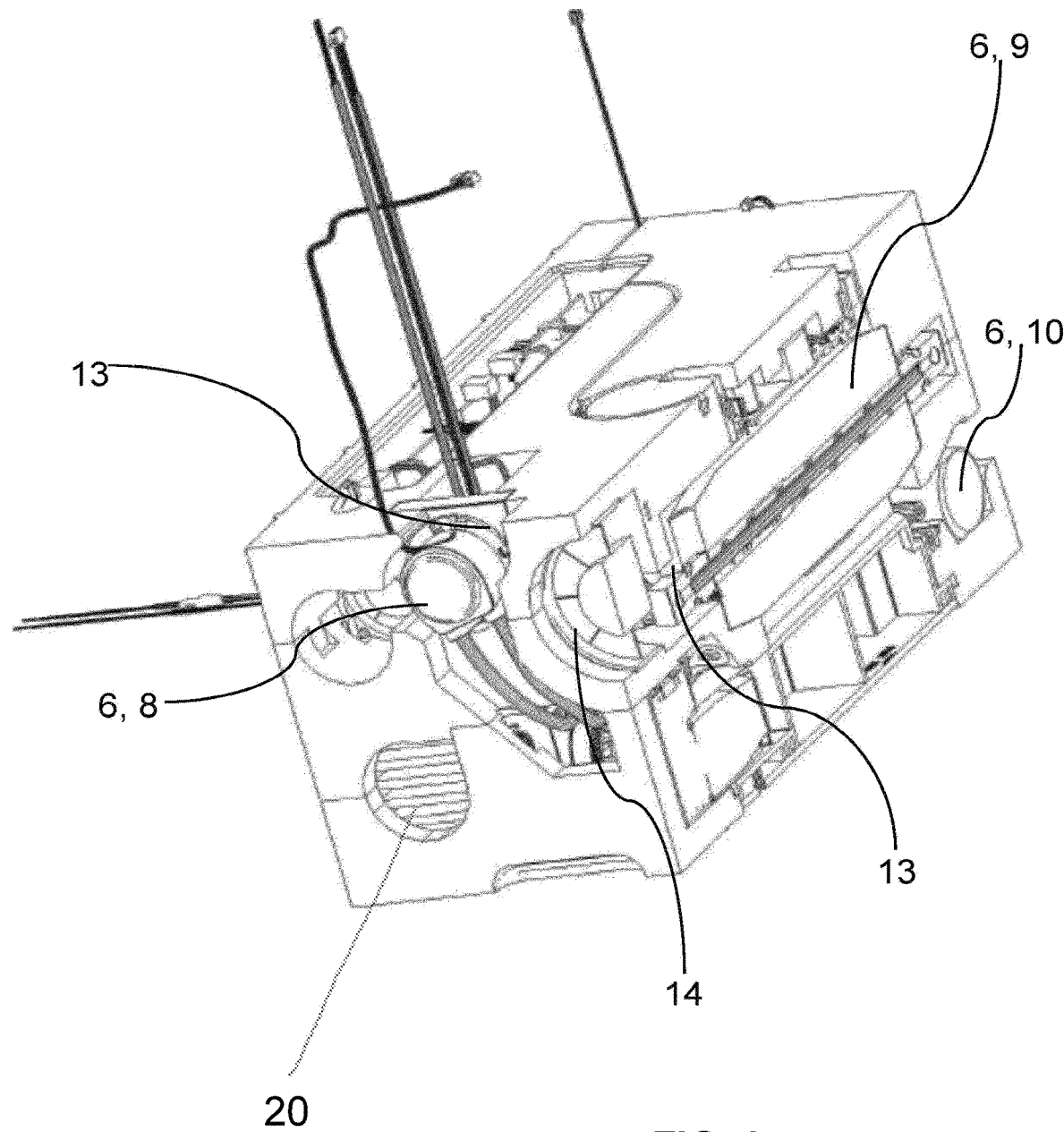
FIG. 3 illustrates the measuring apparatus with the three-piece housing according to FIG. 1 in a cross-sectional view showing the fan and plural ventilation channels.
Figure 4:
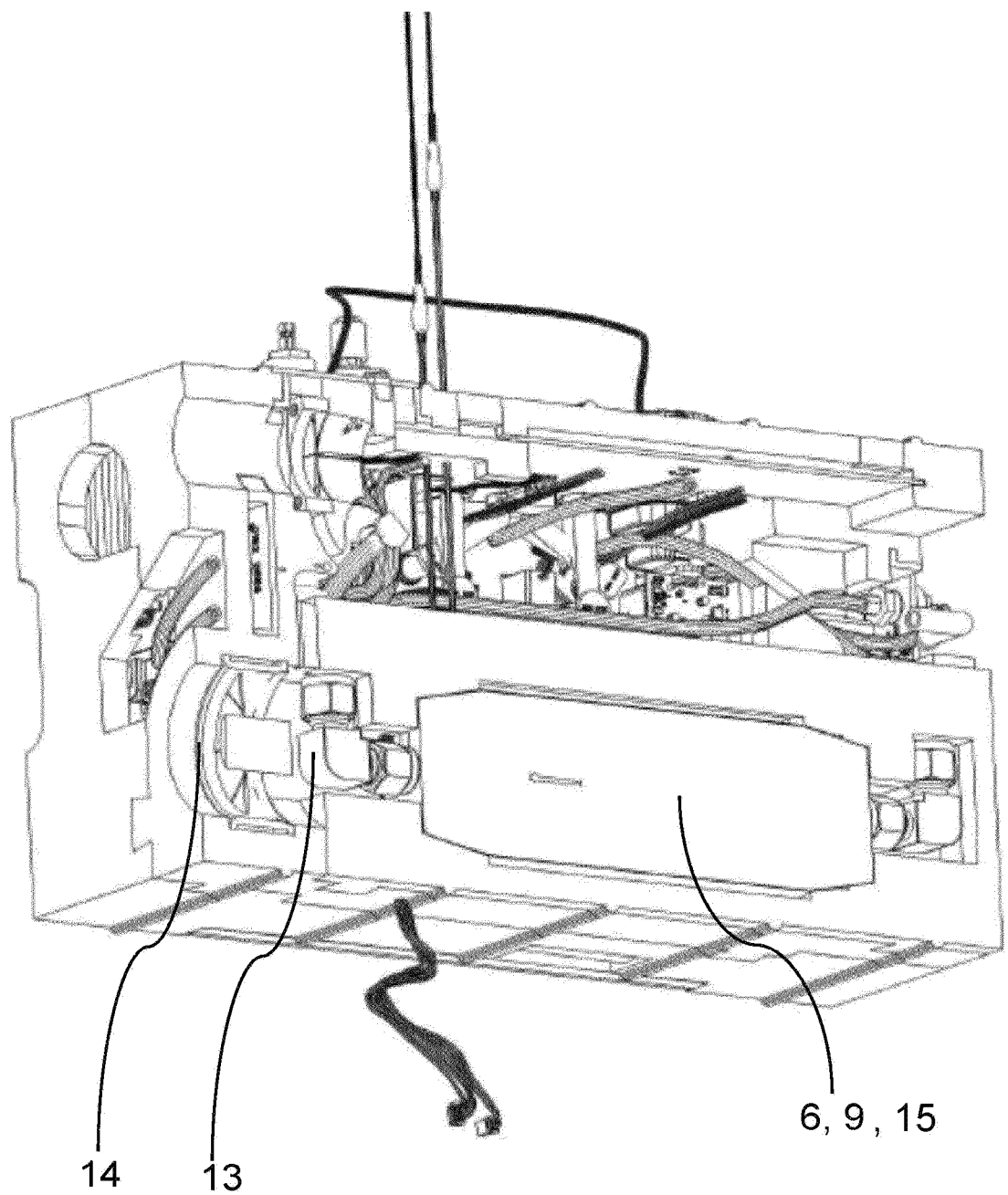
FIG. 4 illustrates the measuring apparatus with the three-piece housing according to FIG. 1 in a cross-sectional view along a X-axis and a Z-axis.
Figure 5:
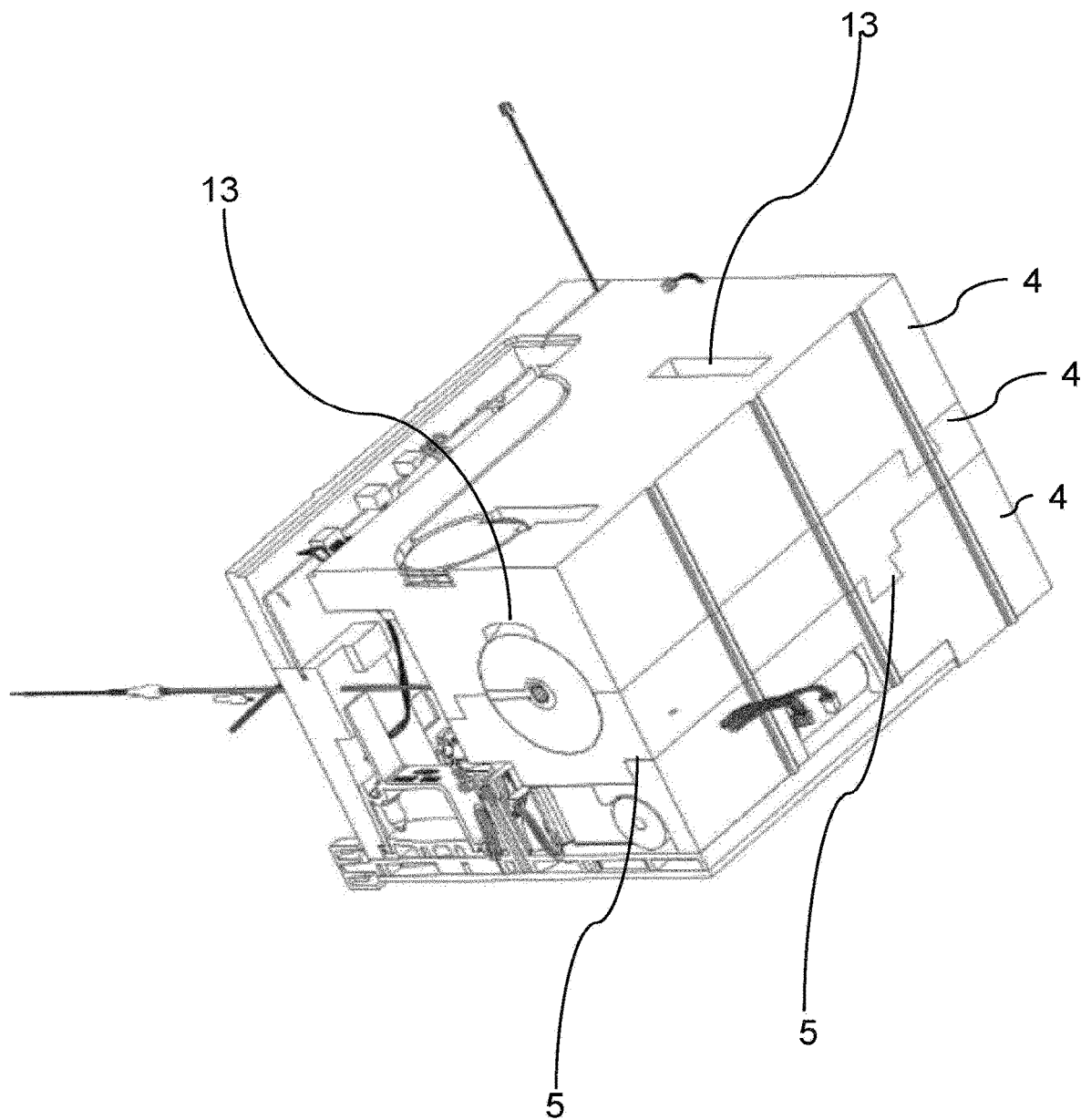
FIG. 5 illustrates the measuring apparatus with the three-piece housing according to FIG. 1 in a cross-sectional view along the X-axis and a Y-axis.
Figure 6:
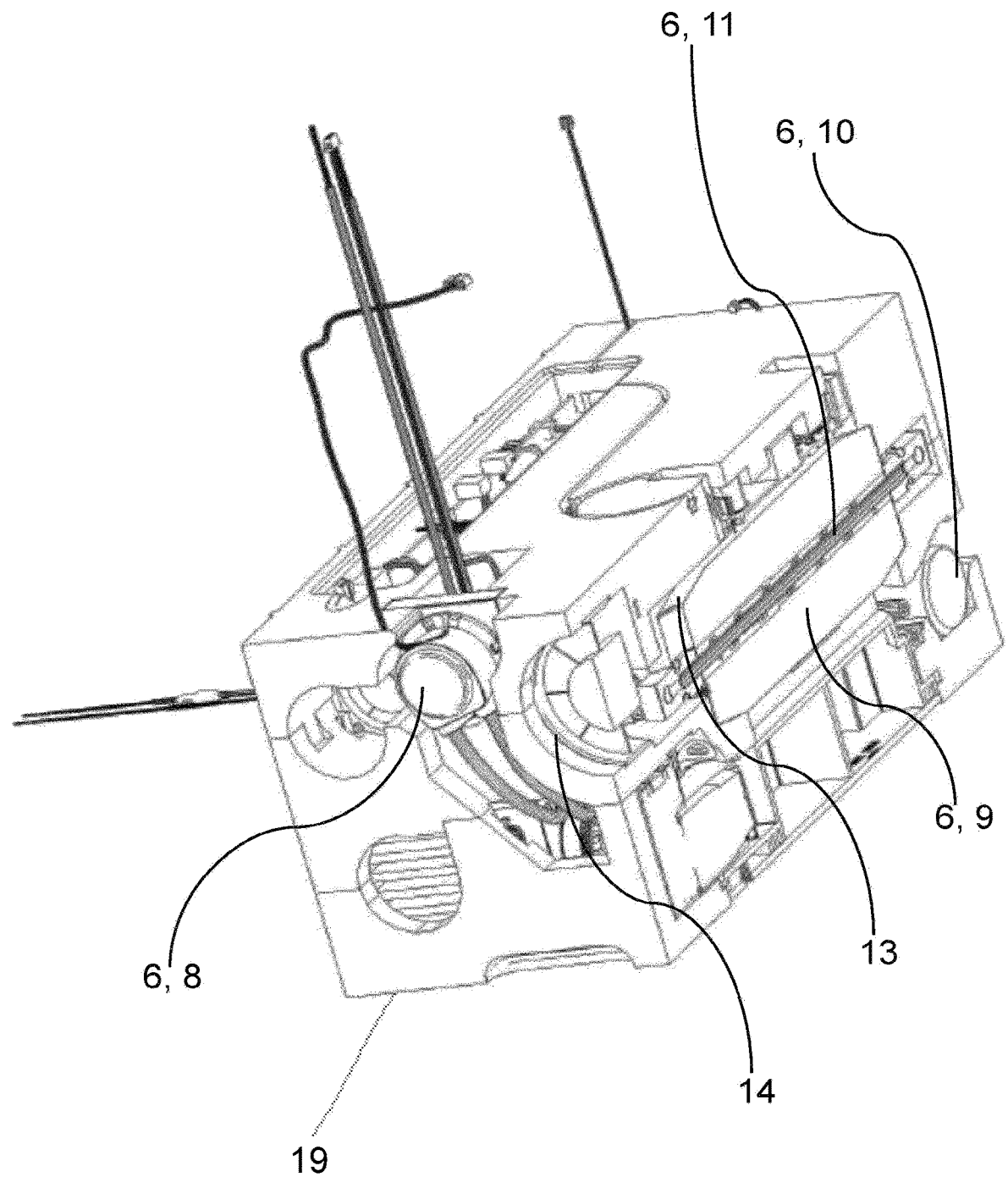
FIG. 6 illustrates the measuring apparatus with the three-piece housing according to FIG. 1 in a cross-sectional view along the Y-axis and the Z-axis.
Figure 7:
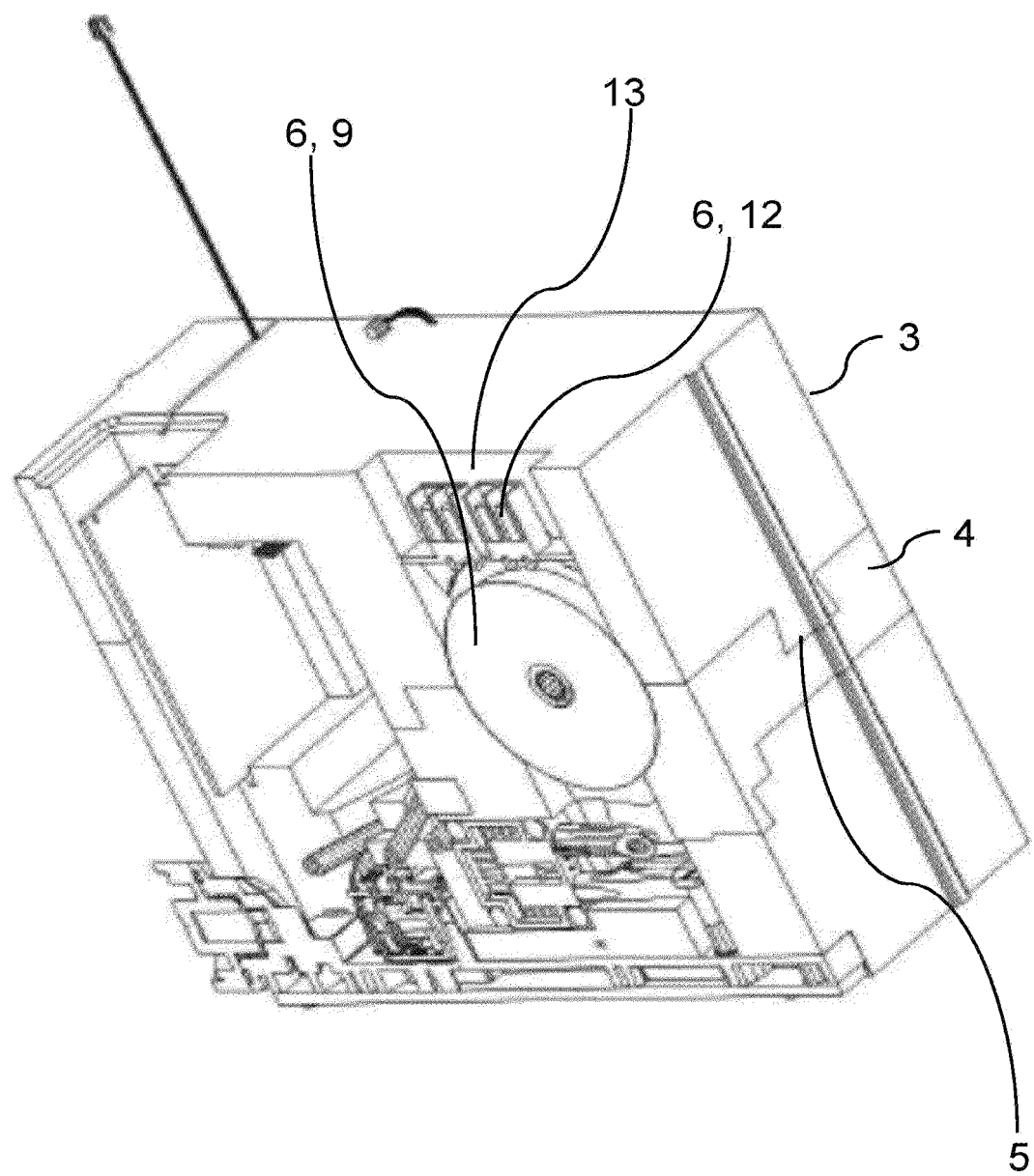
FIG. 7 illustrates the measuring apparatus according to FIG. 1 with the three-piece housing in a cross-sectional view along the X-axis and the Y-axis.

FIGS. 1-7 show that the individual components 6 of the entire measuring apparatus 1 are embedded in and enveloped by the shaped body parts 4. It is evident from the embodiments of FIGS. 2 and 4 that the component 6 an be a filter 7, a pump 8 and an evaporator 9. Further embodiments of the component 6 can be an additional pump 10, a sample channel 11 and electronic components 12 as shown in FIGS. 3, 6 and 7.

It is furthermore evident from FIGS. 3, 4 and 6 that the shaped body 3 forms a ventilation channel 13 that includes a fan 14. The pumps 8 and 10 and the evaporator 9 provided with thermal insulation are subject to a heat exchange through the ventilation channel 13 as evident from FIGS. 3 and 6.

FIGS. 3, 5 and 7 show that the ventilation channel 13 extends at more than one level, so that the component 6 that are arranged over more than one level are cool able.

In order to keep the desired operating temperaturessable, a temperature sensor 15 is arranged in the ventilation channel 13. The components 6 of the measuring apparatus 1 form undercuts 16 with respect to the shaped body 3 which keep with shaped body 3 in one piece in the assembled condition.

FIG. 2 shows that the shaped body 3 includes a recess 17 configured to receive the component 6 configured as the evaporator 9. Thus, the evaporator 9 can be supported form stable in the shaped body 3.

In order to assure reliable and firm support of the individual components 6, a compression rib 18 is formed at or in the shaped body 3 protruding outward from a side wall of the shaped body into the at least one recess 17.

FIGS. 1-7 show a measuring apparatus 1 with a housing 2 and a shaped body 3 made from a foam material wherein at least one additional housing 19 is arranged about the shaped body 3. The at least one additional housing 19 formed from metal or a synthetic material can be configured with at least one ventilation slot 20 at a location where the at least one ventilation channel 13 exits.

According to an advantageous embodiment of the invention a measuring apparatus with at least one housing part 2 is provided wherein the at least one housing part 2 includes a shaped body 3 made from a foam material.

REFERENCE NUMERALS AND DESIGNATIONS 1 measuring apparatus
2 housing part 3 shaped body made from foam material
4 shaped body part
5 positively form locking connection
6 component of measuring apparatus 1
7 filter
8 pump
9 evaporator
10 additional pump
11 sample channel
12 electric component
13 ventilation channel
14 fan
15 temperature sensor
16 component undercuts in shaped body 3
17 recess
18 compression rib
19 additional housing made from metal or synthetic material
20 ventilation slot

What is claimed is:

1. A measuring apparatus, comprising:
   at least one housing part including a shaped body made from a foam material,
   wherein the shaped body forms at least one ventilation channel including at least one fan so that at least one component of the measuring apparatus is coolable,
   wherein the shaped body includes at least one recess configured to receive the at least one component,
   wherein the at least one recess is adapted to a shape of the at least one component gf the measuring apparatus, and
   wherein the at least one component includes a filter, a pump, an evaporator, a sample channel, and an electronic component.

2. The measuring apparatus according to claim 1, wherein the foam material of the shaped body is an expanded synthetic material or an expanded polypropylene or an expanded polystyrol.

3. The measuring apparatus according to claim 1,
   wherein the at least one component is made up of two components, and
   wherein the at least one ventilation channel runs so that the at least two components are coolable in series.

4. The measuring apparatus according to claim 1, wherein the at least one ventilation channel runs at more than one level.

5. The measuring apparatus according to claim 1, wherein a temperature sensor is arranged in the at least one ventilation channel and configured to control the at least one fan.

6. The measuring apparatus according to claim 1, wherein a compression rib is formed at or in the shaped body and protrudes outward from a side wall of the shaped body into at the at least one recess.

7. The measuring apparatus according to claim 1, wherein at least one additional housing is arranged about the shaped body and includes at least one ventilation slot at a location where the at least one ventilation channel exits.

8. The measuring apparatus according to claim 7, wherein the at least one additional housing is made from metal or a synthetic material.

9. A method using a synthetic material for forming a housing of the measuring apparatus according to claim 1.

10. A measuring apparatus, comprising:
    at least one housing part including a shaped body made from a foam material,
    wherein the shaped body forms at least one ventilation channel including at least one fan so that at least one component of the measuring apparatus is coolable,
    wherein the shaped body includes at least one recess configured to receive the at least one component,
    wherein the at least one recess is adapted to a shape of the at least one component of the measuring apparatus,
    wherein the at least one component includes a filter, a pump an evaporator, a sample channel and an electronic component,
    wherein the shaped body is configured in plural shaped body parts, and
    wherein at least two of the shaped body parts of the shaped body are connected by positive form locking transversal to a separation plane of the at least two shaped body parts.

11. The measuring apparatus according to claim 10, wherein the interlocking transversal to the separation plane of the at least two shaped body parts is provided by dove tail profiles.

* * * * *